United States Patent [19]

Johnson

[11] 4,031,469
[45] June 21, 1977

[54] RECEIVER GAIN CALIBRATION
[75] Inventor: Edgar A. Johnson, Tujunga, Calif.
[73] Assignee: The Singer Company, New York, N.Y.
[22] Filed: May 26, 1976
[21] Appl. No.: 690,345

Related U.S. Application Data

[63] Continuation of Ser. No. 612,057, Sept. 10, 1975, abandoned.

[52] U.S. Cl. .................................. 325/363; 325/67; 325/398
[51] Int. Cl.$^2$ ........................................ H04B 17/00
[58] Field of Search ............. 325/18, 67, 363, 398, 325/407, 408; 324/57 H, 78 Z, 59 R; 343/17.7

[56] References Cited
UNITED STATES PATENTS

| 3,273,065 | 9/1966 | Stover | 325/363 |
| 3,559,071 | 1/1971 | Mead et al. | 325/363 |
| 3,624,506 | 11/1971 | Townsend | 325/18 |

Primary Examiner—Robert L. Griffin
Assistant Examiner—Jin F. Ng
Attorney, Agent, or Firm—Charles R. Lewis

[57] ABSTRACT

Receivers with bilateral input stages, such as microwave receivers that are used in noise and RF interference measuring instruments, are gain calibrated in the field by injecting a fixed level calibration signal at the IF frequency into the circuitry between the first mixer and first IF stage. The calibration signal is thus passed through the first mixer where it is converted to the tuned RF frequency and then to the RF input port where its power is measured to control a variable attenuator in series between the calibration signal source and the receiver IF stages. The attenuator is thus automatically adjusted so that the level of the calibration signal entering the IF stage balances the losses in the receiver front end, and a variable gain IF amplifier may be adjusted to produce a predetermined level on the receiver output meter to properly calibrate the instrument.

6 Claims, 2 Drawing Figures

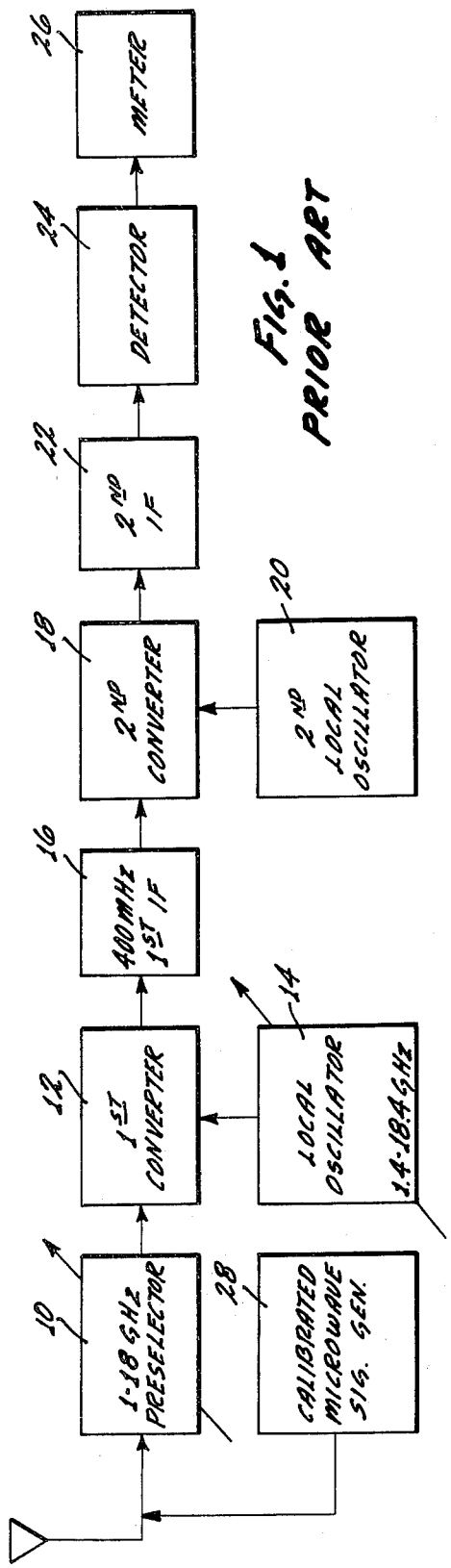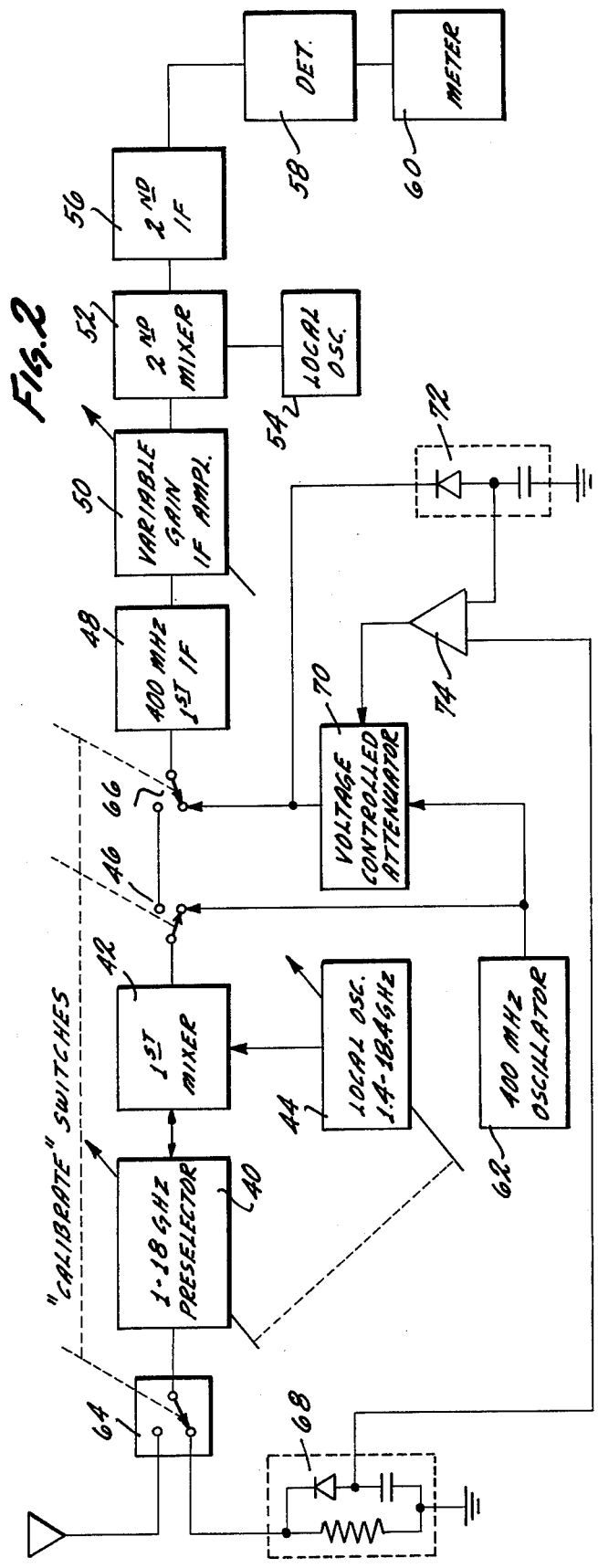

RECEIVER GAIN CALIBRATION

This is a continuation of application Ser. No. 612,057, filed Sept. 10, 1975, now abandoned.

Instruments used for measuring RF field intensity and also interference measuring instruments are carefully calibrated precision radio frequency receivers that are operated by selecting a desired frequency, or its harmonic, on the frequency tuning scale and then noting the amplitude of the received signal on an output meter. In order to assure consistent accuracy, some instruments are provided with a calibration mode which, when employed, actuates calibration circuitry that injects a very low frequency train of narrow square wave pulses into the RF input port, or antenna of the instrument. The amplitudes of these pulses, and their harmonics up to approximately 1 GHz, must be carefully calibrated by the manufacturer at many points in the frequency spectrum of the instrument so that during the life of the instrument, proper calibration can be obtained by the user by merely adjusting the receiver gain so that the output meter reads the level prescribed by the manufacturer during the initial factory calibration.

The disadvantage of the system described above, is that the practical upper frequency limit of calibration circuitry is approximately 1 GHz, thus seriously limiting the range of those instruments that must be gain calibrated in the field.

The gain calibration method described herein, is particularly useful with receivers operating at frequencies in the 1-18 GHz range. In the method to be described, a stable fixed level calibration signal at the frequency of the receiver IF frequency is injected into the circuitry between the first mixer and the IF amplifier. Since practically all receivers that operate in the microwave frequencies have bilateral RF sections, the injected calibration signal enters the normal output of the first mixer stage where it is converted into the frequency to which the receiver is tuned. The converted calibration signal then continues to the RF input port where its power level may be measured to determine the gain, or loss, of the receiver "front end". The calibration signal at the IF frequency that is injected into the circuitry between the mixer and the IF stage, also passes through the IF amplifiers, the subsequent second conversion circuitry the detector circuitry, and to the instrument output meter which displays the power gain through that section of the receiver. The algebraic sum of the power gains measured through the receiver front end and through the receiver IF and detection stages will then yield the gain of the receiver at the frequency to which it is tuned.

In the preferred embodiment of the invention, the RF calibration power measured at the input port of the receiver is applied to a voltage comparator which compares the voltage representing the RF power with a voltage sample representing the power of the calibration signal applied to the IF and detector stages of the receiver. The comparator produces an "error" voltage that is applied to a voltage controlled attenuator in series between the calibration signal source and the first IF stage of the receiver. The output of the voltage controlled attenuator, therefore, injects a signal into the IF stage that is automatically adjusted to compensate for the gain or losses of the receiver RF section at the particular frequency to which the receiver is tuned. The receiver output meter may then indicate the total overall gain of the receiver. The prescribed output level may be attained by adjusting a variable gain amplifier in the IF section of the receiver.

In the drawings which illustrate a preferred embodiment of the invention,

FIG. 1 is a block diagram illustrating the prior art method of gain calibrating a receiver; and FIG. 2 is a block diagram of a receiver containing circuitry for gain calibrating the receiver in accordance with the invention.

FIG. 1 is a block diagram illustrating a typical dual conversion microwave receiver having an RF section which includes a suitable RF band preselector 10 coupled to a first converter 12 which together with a local oscillator 14 produces a heterodyned IF signal that is coupled into a first IF amplifier strip 16. It will be assumed that the receiver being described is designed to receive sinals in the microwave frequencies of approximately 1 to 18 GHz and that local oscillator 14 is adjustable over the range of 1.4 to 18.4 GHz so that first converter 12 will generate an IF frequency of 400 MHz. This first IF frequency is then applied to a second converter 18 which together with a second local oscillator 20, provides a double conversion of the received signal. This signal is then applied to a second IF amplifier 22 and thence to an appropriate detector 24 and output meter 26.

The conventional method for gain calibrating the microwave receiver described above is to connect a microwave signal generator 28 to the antenna or input port of the receiver. Signal generator 28 must be capable of covering the entire frequency range of 1 to 18 GHz at a constant output level over the entire band and a receiver calibration chart may then be developed by noting on meter 26 the output level at varying input frequencies. This calibration chart then accompanies the receiver so that it may be used in the field to obtain accurate readings of received noise or interference.

It is apparent that the above-described prior art method is adequate so long as the receiver retains the calibration; however, because of aging of components and changes caused by vibrations, deterioration, temperature variations, etc., the above-described prior art receiver will not retain its calibration and must be returned to the laboratory to be recalibrated with a laboratory standard microwave signal generator capable of covering the entire RF band at a substantially constant output level.

FIG. 2 is a block diagram of a double conversion microwave receiver similar to that described in connection with FIG. 1, above, but which includes an internal gain calibration system that will permit accurate gain calibration of the receiver over the entire RF range of the receiver. The system permits accurate gain calibration in the field, and it is unnecessary to frequently and repeatedly gain calibrate the receiver with a laboratory standard as is necessary with the conventional prior art receiver described in conjunction with FIG. 1

The microwave receiver of FIG. 2 is a conventional dual conversion superheterodyne receiver for operation in the frequency range of approximately 1 to 18 GHz and includes an RF preselector 40, a first mixer 42 which is coupled to a local oscillator 44 to produce an IF frequency of 400 MHz. The output terminal of mixer 42 is coupled to a function switch 46 which connects that terminal either to the calibration circuitry which will be subsequently described or to the input of an IF amplifier 48. The output of the amplifier 48 is coupled into a variable gain amplifier 50 and thence into the second conversion section comprising a second mixer 52 which is driven by a local oscillator 54 to produce a low second IF frequency which is amplified in amplifier 56, detected in detector 58 and measured in output meter 60.

Most, if not all, receivers that operate in the microwave frequency range utilize RF components that are linear and bilateral in that the microwave frequency signal may pass equally well in either direction through the components. Therefore, it not only is possible to pass the microwave frequency in the range 1–18 GHz from the input port through the preselector 40 to the mixer 42, but it is also possible to introduce a signal at the IF frequency into the exit terminal of the mixer 42 where it is mixed with the frequency from local oscillator 44 to become the microwave frequency to which the receiver is tuned.

The internal calibration circuitry of the receiver includes a substantially stable oscillator 62 which is tuned to the receiver IF frequency and which produces a substantially constant level output signal, typically 1 milliwatt. The output of oscillator 62 is applied to the output terminal of the first mixer 42 through one leg of the calibrate function switch 46 as shown in FIG. 2. The calibration signal from oscillator 62 is mixed in mixer 42 with the signal generated in local oscillator 44 and this new microwave calibration frequency signal then passes through the receiver preselector 40 which, as described in connection with FIG. 1, may be a band pass filter or any type of linear bilateral preselector element. The calibration frequency signal then passes from preselector 40 into a function switch 64 which is one pole of a three-pole double-throw microwave switch ganged together with switch 46 and switch 66. In the calibrate mode, the calibration signal from preselector 40 is applied to a precision power detector 68. In FIG. 2, detector 68 is schematically shown as a series diode-capacitor to ground; however, in order to accurately measure microwave frequencies over a wide band such as 1–18 GHz, it is apparent that one should use one of the well-known microwave measuring techniques, for example, bolometer circuitry.

Since the power output level of oscillator 62 is known, the power measurement derived from the power detector 68 produces an accurate measure of the power losses encountered in the receiver front end. In order to accurately gain calibrate the receiver, it is only necessary to measure the power gains encountered in the other half of the receiver and to algebraically add the two values. In the preferred embodiment illustrated in FIG. 2, this is automatically accomplished.

To automatically calibrate the receiver, the calibration signal to be applied to the first IF amplifier 48 must be adjusted to compensate for the variations of gain encountered in the receiver front end. Therefore, the output of the calibration oscillator 62 is applied to a voltage controlled attenuator 70 and thence to the IF amplifer 48. The ouput of attenuator 70 is also applied to a power detector 72 which must be substantially balanced with the precision power detector 68, but which may be simpler because detector 72 is designed to operate at the fixed 400 MHZ IF frequency being generated by the calibration oscillator 62 whereas detector 68 must be operated over the entire receiver range of 1–18 GHz. The output signals of detectors 68 and 72 are each applied to the input terminals of a differential operational amplifier 74 which, acting as a voltage comparator, produces an error voltage to control the amount of attenuation in the attenuator 70. Thus, the 400 MHz calibration signal from oscillator 62 is attenuated by the attenuator 70 so that the amplitude of the calibration signal entering the amplifier 48 will be identical to the amplitude of the 1 milliwatt microwave calibration signal if it had applied to the input port of the preselector 40. This adjusted calibration signal from the attenuator 70 then passes through the IF amplifier 48 into the variable gain IF amplifier 50 and thence through second mixer 52, second IF amplifier 56 to the detector 58 and the meter 60.

It is apparent that with the self-calibration system described above, it is quite simple to gain calibrate the microwave receiver in the field over the entire input range of the receiver. It is merely necessary to tune the receiver to the appropriate microwave frequency, switch the gain calibration function switches to "calibrate" position, and adjust the variable gain IF amplifier 50 to the predetermined output level on meter 60. Then, returning the ganged switches from calibrate to the "operate" function, an accurate indication of microwave signal strength, at the tuned frequency, may be read directly from the meter 60.

What is claimed is:

1. A method for gain calibrating superheterodyne receivers having a bilateral RF and converter portion at the input thereof, and IF portion, and a detector portion near the output thereof; said method comprising the steps of:

injecting into the output of said RF and converter portion a calibration signal of known amplitude and at the RF and converter portion a calibration signal of known amplitude and at the IF frequency of said receiver;

measuring the level of said calibration signal appearing at the RF input of said receiver to determine the gain of said bilateral RF and converter portion;

injecting said known calibration signal into the portion of said receiver following said bilateral RF and converter portion;

measuring the level of the signal produced at the output of said receiver to determine the gain of said receiver portion following said RF and converter portion; and algebraically adding said RF and converter gain with said gain of said receiver portion following said RF and converter portion to obtain the overall gain of the receiver at the frequency to which it is tuned.

2. A method for gain calibrating superheterodyne receivers having a bilateral RF and converter portion at the input thereof, an IF portion, and a detector portion near the output thereof; said method comprising the steps of:

injecting into the output of said RF and converter portion a first calibration signal of known amplitude and at the IF frequency of said receiver;

measuring the level of said calibration signal appearing at the RF input of said receiver to determine the gain of said bilateral RF and converter portion;

injecting a second known calibration signal appearing at the RF input of said receiver to determine the gain of said bilateral RF and converter portion;

injecting a second known calibration signal into the portion of said receiver following said bilateral RF and converter portion;

measuring the level of the signal produced at the output of said receiver to determine the gain of said receiver portion following said RF and converter portion; and algebraically adding said RF and converter gain with said gain of said receiver portion following said RF and converter portion to obtain the overall gain of the receiver at the frequency to which it is tuned.

3. A method of determining the gain of a superheterodyne receiver having at least a bilateral RF and converter stage at the input thereof, an IF portion, and a detector portion near the output thereof; said method comprising the steps of:

injecting at the output of said RF and converter stage a calibration signal of a known amplitude and at substantially the IF frequency of the receiver;

measuring the level of said calibration signal appearing at the RF input of said receiver to determine the gain of said receiver RF and converter stage;

injecting said calibration signal into the input of the first IF amplifier stage of said receiver with said calibration signal having a predetermined amplitude that has been adjusted to compensate for the gain of said receiver RF and converter stage; and measuring the level of the signal produced at the output of said receiver to obtain the overall gain of said receiver at the frequency to which it is tuned.

4. Circuitry for gain calibrating a superheterodyne receiver having bilateral RF and first converter stages, said circuitry comprising:

signal means for injecting a calibration signal of predetermined amplitude and at the IF frequency of the receiver into the output terminal of the first converter stage of said receiver;

detecting means coupled to the input port of said receiver for measuring the power level of the calibration signal and for generating a signal indicative of said power level;

an error signal controlled variable attenuator coupled to receive said calibration signal of predetermined amplitude from said signal means, said attenuator being coupled to transmit an attenuated calibration signal to the input terminal of the first IF amplifier of said receiver;

comparison means responsive to the signal generated by said detecting means and to the attenuated calibration signal from said variable attenuator for generating an error signal indicative of the difference between said detecting means signal and said attenuated calibration signal, said error signal being coupled to control said variable attenuator, whereby said attenuated calibration signal represents the predetermined amplitude of said signal means calibration signal minus the losses in the RF and first converter stages of said receiver; and means coupled to the output terminal of said receiver for indicating the power gain of said attenuated calibration signal.

5. The circuitry claimed in claim 4 wherein said detecting means comprises a power detector coupled to the input port of said receiver for receiving and measuring the power level of the calibration signal from said signal means after said calibration signal is frequency converted by the first converter in said receiver.

6. The circuitry claimed in claim 4 wherein said comparision means includes a power detector coupled to the output of said variable attenuator for measuring the power level of said attenuated calibration signal, and further includes a comparision circuit for comparing the output signal from said power detector with the output signal from said detecting means, said comparison circuitry generating said error signal indicative of the difference between said output signals.

* * * * *